(12) United States Patent
Tseng

(10) Patent No.: US 9,024,660 B2
(45) Date of Patent: May 5, 2015

(54) DRIVING CIRCUIT WITH ZERO CURRENT SHUTDOWN AND A DRIVING METHOD THEREOF

(71) Applicant: Silergy Semiconductor Technology (Hangzhou) Ltd, Hangzhou, ZheJiang Province (CN)

(72) Inventor: Jaime Tseng, Hangzhou (CN)

(73) Assignee: Silergy Semiconductor Technology (Hangzhou) Ltd., Hangzhou (CN)

( * ) Notice: Subject to any disclaimer, the term of this patent is extended or adjusted under 35 U.S.C. 154(b) by 256 days.

(21) Appl. No.: 13/747,631

(22) Filed: Jan. 23, 2013

(65) Prior Publication Data

US 2013/0127496 A1 May 23, 2013

Related U.S. Application Data

(63) Continuation of application No. 13/373,497, filed on Nov. 16, 2011, now Pat. No. 8,400,185.

(30) Foreign Application Priority Data

Dec. 3, 2010 (CN) .......................... 2010 1 0588554

(51) Int. Cl.
| | |
|---|---|
| G05F 3/20 | (2006.01) |
| H03K 19/0175 | (2006.01) |
| H03K 19/0944 | (2006.01) |
| H03K 19/0185 | (2006.01) |
| H03K 19/00 | (2006.01) |

(52) U.S. Cl.
CPC .... *H03K 19/018507* (2013.01); *H03K 19/0016* (2013.01)

(58) Field of Classification Search
USPC ......... 326/83, 82, 89; 327/540; 323/315, 316, 323/901
See application file for complete search history.

(56) References Cited

U.S. PATENT DOCUMENTS 6,016,050 A * 1/2000 Brokaw ........................ 323/315
6,118,263 A 9/2000 O'Neill et al.

\* cited by examiner

*Primary Examiner* — Daniel D Chang
(74) *Attorney, Agent, or Firm* — Michael C. Stephens, Jr.

(57) ABSTRACT

Methods and circuits related to a driving circuit with zero current shutdown are disclosed. In one embodiment, a driving circuit with zero current shutdown can include: a linear regulating circuit that receives an input voltage source, and outputs an output voltage; a start-up circuit having a threshold voltage, the start-up circuit receiving an external enable signal; a first power switch receiving both the output voltage of the linear regulating circuit and the external enable signal, and that generates an internal enable signal, the internal enable signal being configured to drive a logic circuit; when the external enable signal is lower than a threshold voltage, the driving circuit is not effective; when the external enable signal is higher than the threshold voltage, the start-up circuit outputs a first current; and where the output voltage at the first output terminal is generated by the linear regulating circuit based on the first current.

16 Claims, 5 Drawing Sheets

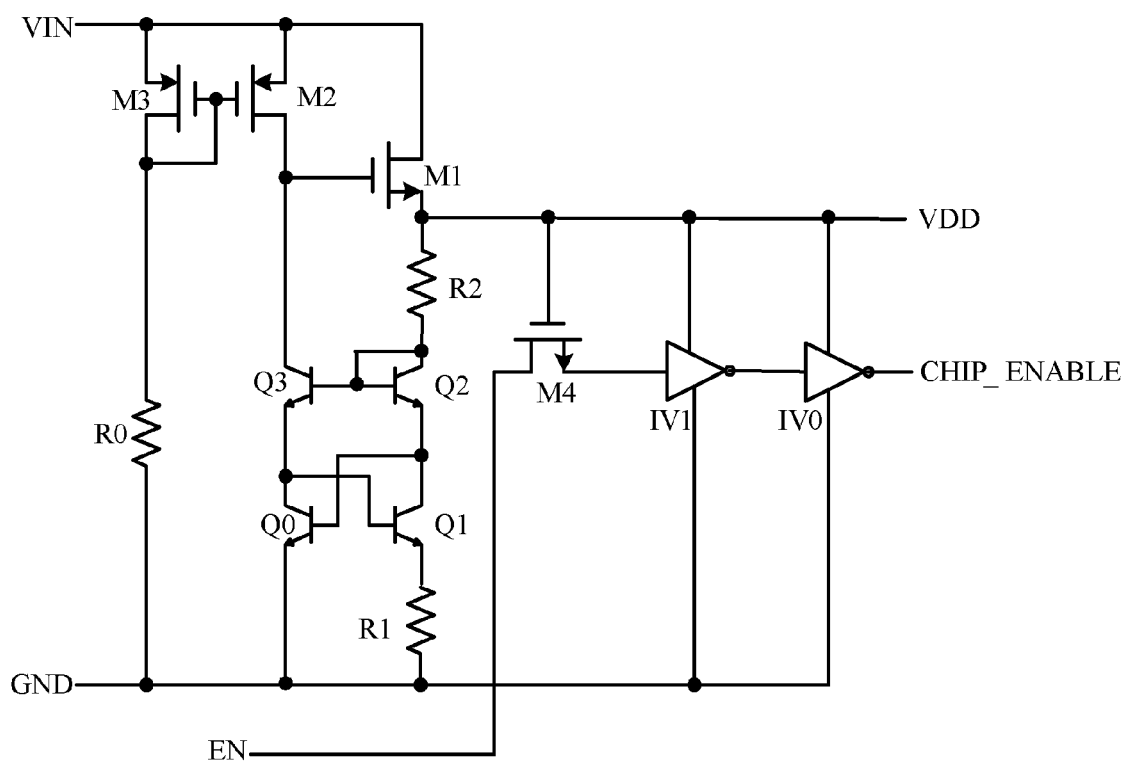
FIG. 1 (conventional)

DRIVING CIRCUIT WITH ZERO CURRENT SHUTDOWN AND A DRIVING METHOD THEREOF

RELATED APPLICATIONS

This application is a continuation of the following application, U.S. patent application Ser. No. 13/373,497, entitled "DRIVING CIRCUIT WITH ZERO CURRENT SHUTDOWN AND A DRIVING METHOD THEREOF," filed on Nov. 16, 2011, now issued as U.S. Pat. No. 8,400,185, and which is hereby incorporated by reference as if it is set forth in full in this specification, and which also claims the benefit of Chinese Patent Application No. CN201010588554.X, filed on Dec. 3, 2010, which is incorporated herein by reference in its entirety.

FIELD OF THE INVENTION

The present invention generally relates to electronic circuits. More specifically, particular embodiments relate to a driving circuit with zero current shutdown and methods of operating the driving circuit.

BACKGROUND

An integrated chip for power applications may generally include an input pin to receive an external input voltage source, an enable pin to receive an external enable signal, and a ground pin coupled to a ground supply node. An internal driving circuit may be employed to convert the external input voltage received to a voltage supply to drive other devices or internal circuitry, and to convert the external enable signal to an enable signal for internal logic circuits inside the integrated chip.

However, when the chip is in an off condition, the source of a bias current used by the driving circuit may still be in existence, and this can result in avoidable power loss. As a result, the effective lifetime of the power supply may be reduced due to such power loss for an input power supply having fixed total energy, such as a battery. In addition, the higher the input voltage source is, the larger the power loss that is typically incurred.

SUMMARY

Embodiments of the present invention relate to a driving circuit with zero current shutdown. For example, a driving circuit can generate an output voltage and an internal enable signal only when the external enable signal is higher than a threshold voltage by a start-up circuit. While the external enable signal is low, indicating that the chip is turned off, the driving circuit may be out of operation, and there is no output voltage and no internal enable signal enabled.

In one embodiment, a driving circuit with zero current shutdown can include: (i) a linear regulating circuit configured to receive an input voltage source, and to output an output voltage at a first output terminal; (ii) a start-up circuit having a threshold voltage, the start-up circuit being configured to receive an external enable signal; (iii) a first power switch configured to receive both the output voltage of the linear regulating circuit and the external enable signal, and to generate an internal enable signal at a second output terminal, the internal enable signal being configured to drive a logic circuit; (iv) when the external enable signal is lower than a threshold voltage, the driving circuit is not effective; (v) when the external enable signal is higher than the threshold voltage, the start-up circuit is configured to output a first current; and (vi) where the output voltage at the first output terminal is generated by the linear regulating circuit in accordance with the first current.

In one embodiment, a driving method with zero current shutdown, can include: (i) receiving an external enable signal; (ii) determining that a chip is in shutdown when the external enable signal is lower than a threshold voltage; (iii) determining that the chip is out of shutdown and generating a first current when the external enable signal is higher than the threshold voltage; (iv) generating, by a linear regulating circuit, an output voltage at a first output terminal based on the first current; and (v) generating an internal enable signal to drive internal logic at a second output terminal through a first power switch that is driven by the external enable signal and the output voltage.

Embodiments of the present invention can advantageously provide reduced power loss because there is no bias current during the chip off condition, and the shutdown current is essentially zero. Particular embodiments can also provide improved linear regulation effects relative to conventional approaches because the bias current does not vary substantially with the input voltage source during normal chip conditions, which also reduces power loss and increases conversion efficiency. Other advantages of the present invention will become readily apparent from the detailed description of preferred embodiments below.

BRIEF DESCRIPTION OF THE DRAWINGS

FIG. 1 is a block schematic diagram of a conventional driving circuit with zero current shutdown.

DETAILED DESCRIPTION

Figure 2:
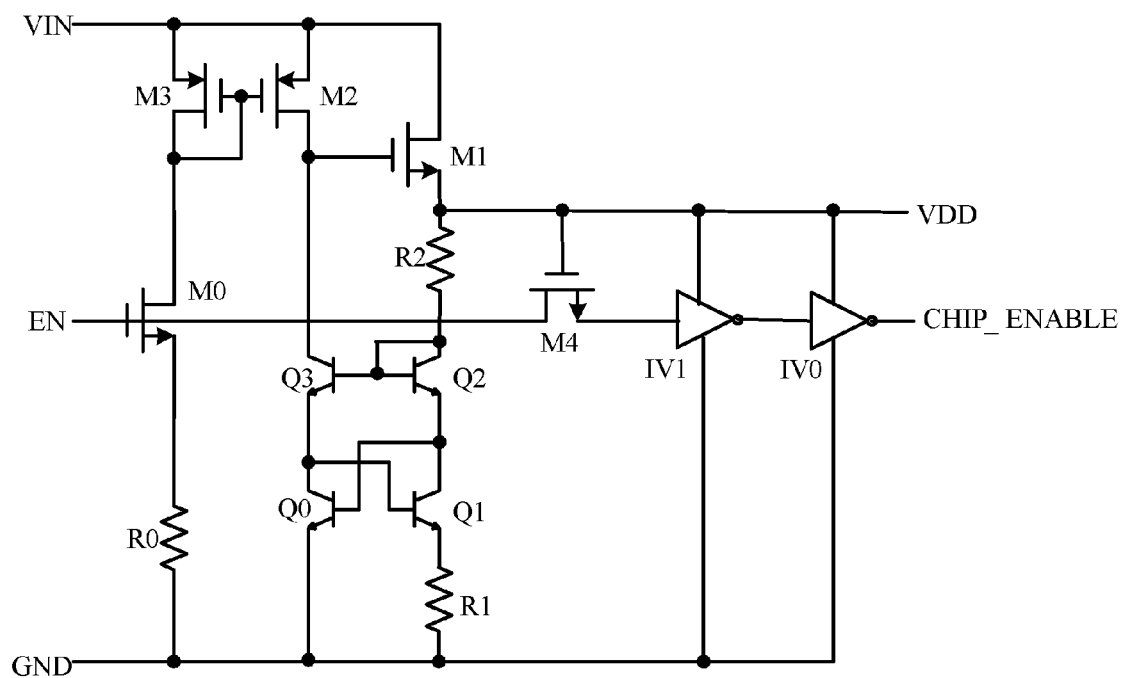
FIG. 2 is a block schematic diagram of a first example driving circuit with zero current shutdown in accordance with embodiments of the present invention.

Reference will now be made in detail to particular embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents that may be included within the spirit and scope of the invention as defined by the appended claims. Furthermore, in the following detailed description of the present invention, numerous specific details are set fourth in order to provide a thorough understanding of the present invention. However, it will be readily apparent to one skilled in the art that the present invention may be practiced without these specific details. In other instances, well-known methods, procedures, processes, components, structures, and circuits have not been described in detail so as not to unnecessarily obscure aspects of the present invention.

Some portions of the detailed descriptions which follow are presented in terms of processes, procedures, logic blocks, functional blocks, processing, schematic symbols, and/or other symbolic representations of operations on data streams, signals, or waveforms within a computer, processor, controller, device and/or memory. These descriptions and representations are generally used by those skilled in the data processing arts to effectively convey the substance of their work to others skilled in the art. Usually, though not necessarily, quantities being manipulated take the form of electrical, magnetic, optical, or quantum signals capable of being stored, transferred, combined, compared, and otherwise manipulated in a computer or data processing system. It has proven convenient at times, principally for reasons of common usage, to refer to these signals as bits, waves, waveforms, streams, values, elements, symbols, characters, terms, numbers, or the like.

Furthermore, in the context of this application, the terms "wire," "wiring," "line," "signal," "conductor," and "bus" refer to any known structure, construction, arrangement, technique, method and/or process for physically transferring a signal from one point in a circuit to another. Also, unless indicated otherwise from the context of its use herein, the terms "known," "fixed," "given," "certain" and "predetermined" generally refer to a value, quantity, parameter, constraint, condition, state, process, procedure, method, practice, or combination thereof that is, in theory, variable, but is typically set in advance and not varied thereafter when in use.

Embodiments of the present invention can advantageously provide reduced power loss because there is no bias current during the chip off condition, and the shutdown current is essentially zero. Particular embodiments can also provide improved linear regulation effects relative to conventional approaches because the bias current does not vary substantially with the input voltage source during normal chip conditions, which also reduces power loss and increases conversion efficiency. The invention, in its various aspects, will be explained in greater detail below with regard to exemplary embodiments.

An example conventional driving circuit that may be found inside an integrated chip is shown in FIG. 1. In this example, input pin VIN may receive external voltage source $V_{IN}$, the GND pin can be grounded, and the EN pin can receive the external enable signal. A voltage supply can be generated at the VDD terminal to provide supply, e.g., to internal devices inside the chip, and an enable signal may be generated at the CHIP_ENABLE terminal to enable, e.g., internal logic circuits. The driving circuit can be a linear circuit and can include power switch M1, transistors Q0, Q1, Q2, Q3, resistors R1 and R2, a current mirror including transistors M2 and M3, and a power switch (e.g., transistor M4).

Example operation of the driving circuit shown in FIG. 1 may be follows: when the input voltage $V_{IN}$ is higher than the threshold voltage $V_{TP}$ of power switch M3, current $I_0$ may be generated through resistor R0, the value of which may be calculated according to the following equation (1):

$$I_0 = V_{IN} - V_{TP}/R_0 \qquad (1)$$

The current mirror that includes transistors M3 and M2 mirrors the current $I_0$ and outputs a mirror current as the bias current to the linear regulating circuit, which outputs an output voltage at the $V_{DD}$ terminal. The gate of the power switch M4 can connect to $V_{DD}$, the drain may connect to the external enable signal EN, and the source can connect to inverters IV0 and IV1 that are coupled in series. The output of the inverter IV0 can be employed as the internal enable signal CHIP_ENABLE.

When a conventional driving circuit of a chip as shown in the example of FIG. 1 operates in a normal condition, the linear regulation circuit can receive a bias current to generate an output voltage, and power switch M4 can output an internal enable signal on the basis of the received external enable signal and the output signal. However, when the chip is in an off condition, the source of the bias current $I_0$ may still be in existence (the value of the bias current is equal to $(V_{IN}-V_{TP})/R_0$), which can result in avoidable power loss. The effective lifetime of the power supply may be reduced due to such power loss for an input power supply having fixed total energy, such as a battery.

Further, the effect of linear regulation may be undesirable because of variation of the bias current $(V_{IN}-V_{TP})/R_0$ with the input voltage source. Generally, the higher the input voltage source is, the larger the power loss incurred.

Referring now to FIG. 2, a block schematic diagram of a first example driving circuit with zero current shutdown in accordance with embodiments of the present invention is shown. The example driving circuit of FIG. 2 includes a linear regulating circuit, a first power switch, a start-up circuit, and a current mirror.

The linear regulating circuit can include power switch M1, bipolar transistors Q0, Q1, Q2, and Q3, resistor R2 that can connect in series between power switch M1 and bipolar transistor Q2, and resistor R1 that can connect in series between bipolar transistor Q1 and ground. The linear regulating circuit may be configured to generate output voltage $V_{DD}$ at an output terminal according to the received input voltage $V_{IN}$.

In this particular example, the first power switch M4 may be implemented as a P-type MOSFET. The gate of power switch M4 can connect the output terminal to output at substantially constant output voltage $V_{DD}$, the drain of power switch M4 can connect external enable signal EN, and the source of power switch M4 may be coupled to inverters IV0 and IV1. In addition, power switch M4 can also (e.g., via inverters IV0 and IV1) output an enable signal CHIP_ENABLE to drive one or more internal logic circuits, and/or external circuitry.

The start-up circuit can include power switch M0 and resistor R0. For example, power switch M0 may be implemented as a P-type MOSFET, the gate of power switch M0 can be connected to the external enable signal EN, and the source of power switch M0 may be grounded via resistor R0. Of course, other configurations and circuit arrangement may be appreciated by one skilled in the art, particularly depending on the types of transistors chosen for implementation.

A first current mirror CM1 may be configured as a cascade current mirror, and can include both transistors (or power switches) M2 and M3, the sources of which may be connected to the input voltage source $V_{IN}$. The drain of power switch M3 can be connected to both the drain of power switch M0 and the common node between the gates of power switches M2 and M3, and the drain of power switch M2 can connect to the gate of power switch M1.

In the following, an example operation of the driving circuit shown in FIG. 2 will be described. When external enable signal EN is low, there may be no current in the driving circuit, and the output voltage $V_{DD}$ is at or about zero.

However, when external enable signal EN goes higher than the threshold voltage $V_{TP}$ of the power switch M0, the power switch M0 may be turned on, first current $I_0$ can be generated at a first side of power switch M3, and the value of which can be calculated as in equation (2):

$$I_0 = \frac{EN - V_{TP\_M0}}{R_0} \quad (2)$$

Mirror current $I_1$ can be generated on a second or the other side of the current mirror, such as the side of the power switch M2, through the current mirror, and then be transferred to the linear regulating circuit as the bias current $I_{bias}$. Also, a substantially constant output voltage $V_{DD}$ can be generated as indicated under the action of the linear regulating circuit.

The current $I_2$ flowing through power switch M1 can be calculated by equation (3) on the basis of the principle of the linear regulating circuit and the mirror circuit:

$$I_2 = \frac{V_{BEQ0} - V_{BEQ1}}{R1} \quad (3)$$

Thereby, the output voltage $V_{DD}$ at a first output terminal may be calculated as indicated by equation (4):

$$V_{DD} = 2V_{BEQ2} + I_2 \times R_2 \quad (4)$$

Further, the voltage $V_{DD}$ and the external enable signal EN can be respectively transferred, or otherwise connected or coupled, to the gate and the drain of power switch M4. Also, enable signal CHIP_ENABLE can be generated by inverters IV1 and IV0, which may be coupled in series to the drain of power switch M4, in order to drive one or more internal logic circuits of the chip, and/or to enable other external circuitry.

According to the operation of the above example, it can be concluded that no additional power loss is generated due to the "out of operation" of the linear regulation circuit and the lack of bias current when the chip is in an off condition or "shutdown." The linear regulating circuit may be in operation only when the external enable signal is higher than a threshold that is related to the threshold voltage of power switch M0. The first current $I_0$ determined by the threshold voltage $V_{TP}$ of power switch M0 and resistor R0 may be sufficient to provide the bias current needed for start-up of the linear regulating circuit.

Sufficient bias current for the linear regulation circuit can be achieved by the selection of resistor R0 with relatively less resistance, or current mirror CM1 with relatively higher amplification factor, which may result in a higher quiescent current to the driving circuit when the pin EN and pin VIN are combined as one. It can be concluded that the particular example shown in FIG. 2 may be especially applicable to the condition of a relatively narrow range of the input voltage source and fixed amplitude of external enable signal EN.

Figure 3:
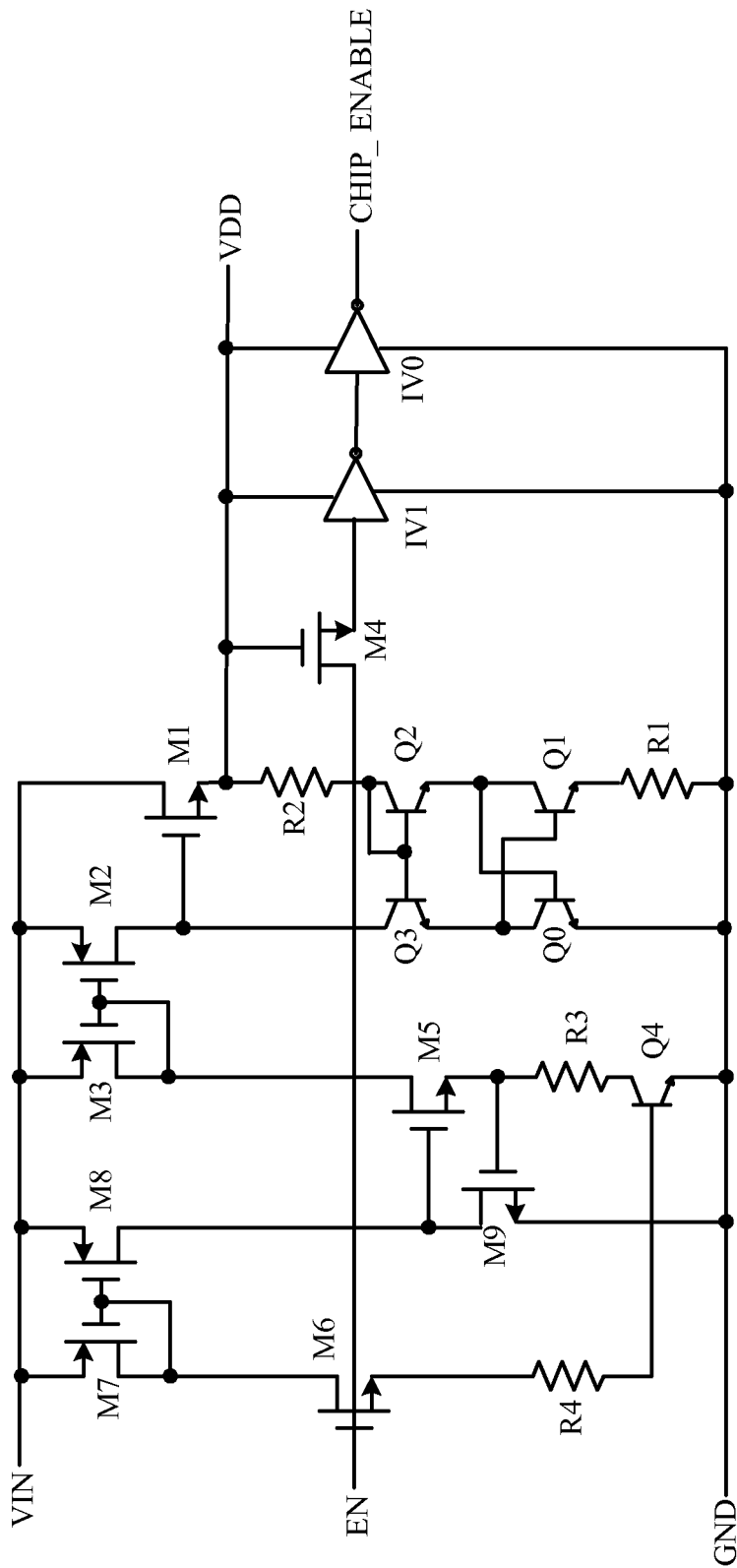
FIG. 3 is a block schematic diagram of a second example driving circuit with zero current shutdown in accordance with embodiments of the present invention.

Referring now to FIG. 3, a block schematic diagram of a second example driving circuit in accordance with embodiments of the present invention is shown. A feedback circuit and a second current mirror CM2 may be configured between the start-up circuit and the linear regulating circuit, as compared to the example shown in FIG. 2.

The second current mirror CM2 can include power switches M2 and M3 configured to mirror the current generated by the feedback circuit, and may then be transferred or otherwise connected or coupled to the linear regulating circuit as the bias current. In addition, the feedback circuit can include power switch M5, power switch M9, resistor R3 and NPN-type bipolar transistor Q4.

In a particular P-type MOSFET example, power switch M5 and power switch M9 may be coupled between current mirrors CM1 and CM2 respectively. Accordingly, the gate of power switch M5 can connect to current mirror CM1, the drain of power switch M5 can connect to current mirror CM2, and the source of power switch M5 can connect to the common node between the gate of power switch M9 and resistor R3. The drain of power switch M9 can connect to the current mirror CM1, and the source of power switch M9 can be grounded. The collector of the NPN-type bipolar transistor Q4 can connect to the other terminal of resistor R3, the emitter of transistor Q4 can be grounded, and the base of transistor Q4 can connect to resistor R4.

The feedback circuit can be configured to receive the starting current from the start-up circuit, and generate a substantially constant bias current to the linear regulating circuit. Example operation of the driving circuit shown in FIG. 3 may be as follows.

Similar to the example shown above in FIG. 2, when the external enable signal EN is low, there may be no current in the driving circuit and the output voltage $V_{DD}$ may be at or about zero.

However, when external enable signal EN goes higher than the sum of the threshold voltage $V_{TP}$ of power switch M6 and threshold voltage $V_{BE}$ of the NPN-type bipolar transistor Q4, a starting current $I_0$ may be generated via resistor R4 that flows through the base of transistor Q4, where the starting current $I_0$ may follow a formula like as indicated in equation (5):

$$I_0 = \frac{EN - V_{TP\_M0} - V_{BEQ4}}{R_4} \quad (5)$$

After power switch M6 turns on, the gate voltage of power switch M5 can be pulled up by the current flowing through power switches M7 and M8, and then the gate voltage of the power switch M9 can be pulled up by the current flowing through the power switch M5. The rise of the gate voltage of power switch M9 may also decrease the gate voltage of the power switch M5, and the above operation repeats again and again. The gate voltage of power switch M9 can be clamped to a voltage that is slightly higher than threshold voltage $V_{TP}$. Therefore, the current $I_1$ flowing through the drain of power switch M5 can be calculated according to the following equation (6) as a substantially constant value:

$$I_1 = \frac{V_{TP\_M8}}{R_3 + R_{on\_Q4}} \quad (6)$$

The current $I_1$ may be mirrored as the second mirror current by the current mirror CM2 that includes power switches M2 and M3. The linear regulating circuit may receive this second mirror current as the bias current, and output a constant output voltage $V_{DD}$ at the first output terminal.

As discussed above, it can be inferred that the current $I_2$ flowing through the resistor R2 follows a formula according the operation principle of the linear regulating circuit, as indicated in equation (7):

$$I_2 = \frac{V_{BEQ0} - V_{BEQ1}}{R_1} \quad (7)$$

Thereby, the output voltage at a first output terminal can be determined as the following formula as indicated in equation (8):

$$V_{DD} = 2V_{BEQ2} + I_2 \times R_2 \quad (8)$$

As a result, the current $I_1$ as the source of the bias current of the linear regulating circuit has a substantially constant value that is not relevant to the input voltage source, so a better regulating effect can be achieved in certain embodiments.

An NPN-type bipolar transistor may be employed as the transistor Q4 in this particular example. As compared to an N-type MOSFET, the base voltage of the bipolar transistor is lower than its threshold voltage $V_{BE}$, however, the gate voltage of N-type MOSFET is higher than its threshold voltage $V_{TN}$ during operation. For the condition that external enable signal EN and input voltage source are connected to each other, the gate oxide may be broken when the input voltage source $V_{IN}$ is higher (e.g., higher than about 6V) if an N-type MOSFET is employed. Therefore, the example of FIG. 3 that employs an NPN type bipolar transistor as transistor Q4 can be used more widely. However, other types of transistors can also be applicable when the input voltage source is low, such as an N-type MOSFET transistor.

As one skilled in the art will recognize, implementation of the linear regulating circuit can also be other suitable circuit topologies that can achieve the linear regulating effect as shown in the examples of FIGS. 2 and 3. Thus, these particular examples are not intended to limit the circuit topology of the linear regulating circuit to the examples shown in FIGS. 2 and 3.

Reference will now be made in detail to driving methods in accordance with particular embodiments, examples of which are illustrated in the accompanying drawings of FIGS. 4 and 5.

Figure 4:
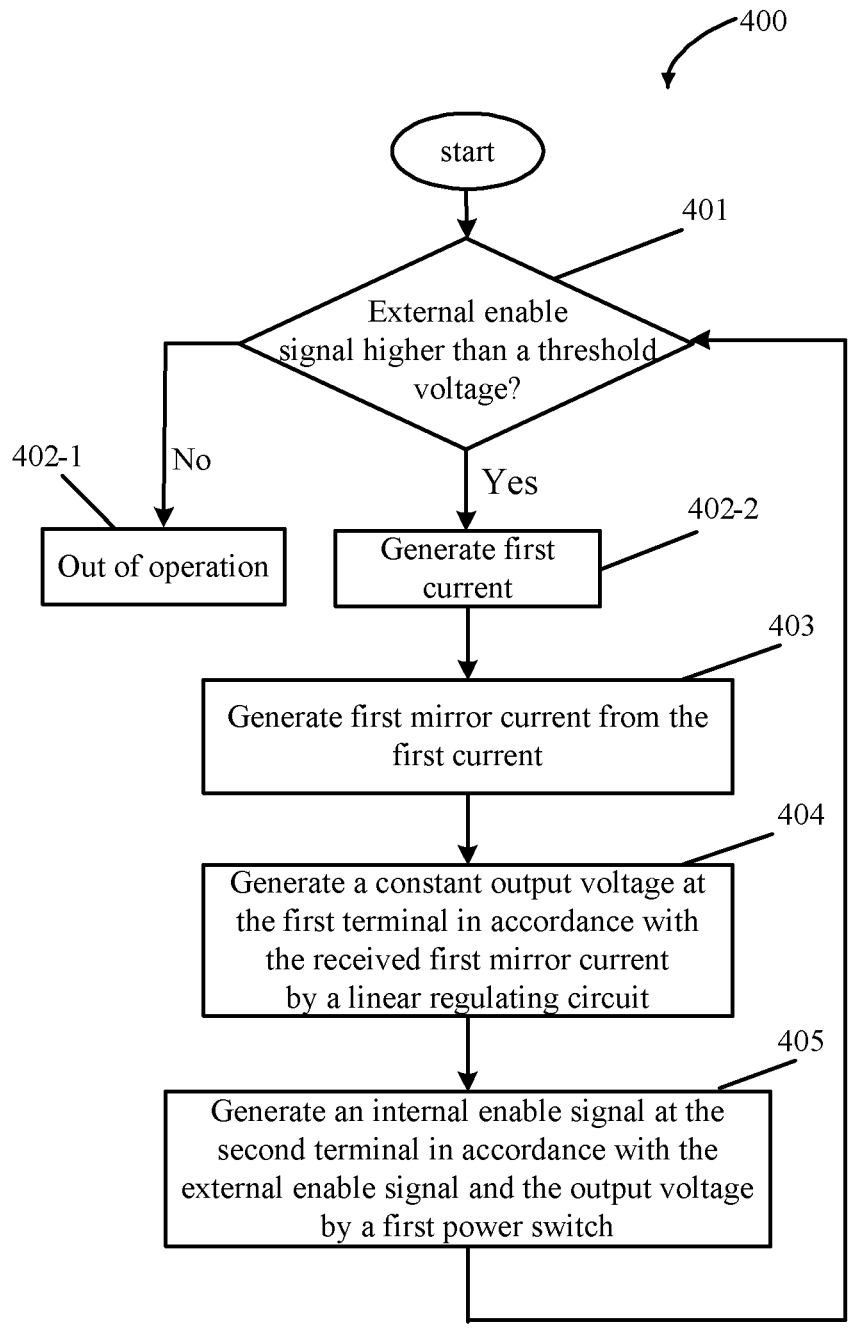
FIG. 4 is a flow diagram of a first example driving method with zero current shutdown in accordance with embodiments of the present invention.

Referring now to FIG. 4, shown is a flow diagram 400 of a first example driving method in accordance with embodiments of the present invention. At 401, an external enable signal can be received and determined as being higher or lower than a threshold voltage. At 402-1, the driving circuit is out of operation if the external enable signal is lower than the threshold voltage. At 402-2, the start-up circuit can generate a first current if the external enable signal is higher than the threshold voltage.

At 403, the first current can be mirrored to generate a first mirror current that is transferred to the linear regulating circuit as the bias current. At 404, the linear regulating circuit can receive the first mirror current and output a substantially constant output voltage signal at a first output terminal. At 405, a first power switch may generate an enable signal to drive, e.g., chip internal logic circuit according to the external enable signal and the output voltage signal of the linear regulating circuit.

In this fashion, no additional power loss may be due to the out of operation of the linear regulation circuit and the lack of bias current when the chip is in an off condition or in a "shutdown" state. The linear regulating circuit may be in operation only when the external enable signal is higher than a threshold that may be related to the threshold voltage of a second power switch.

Figure 5:
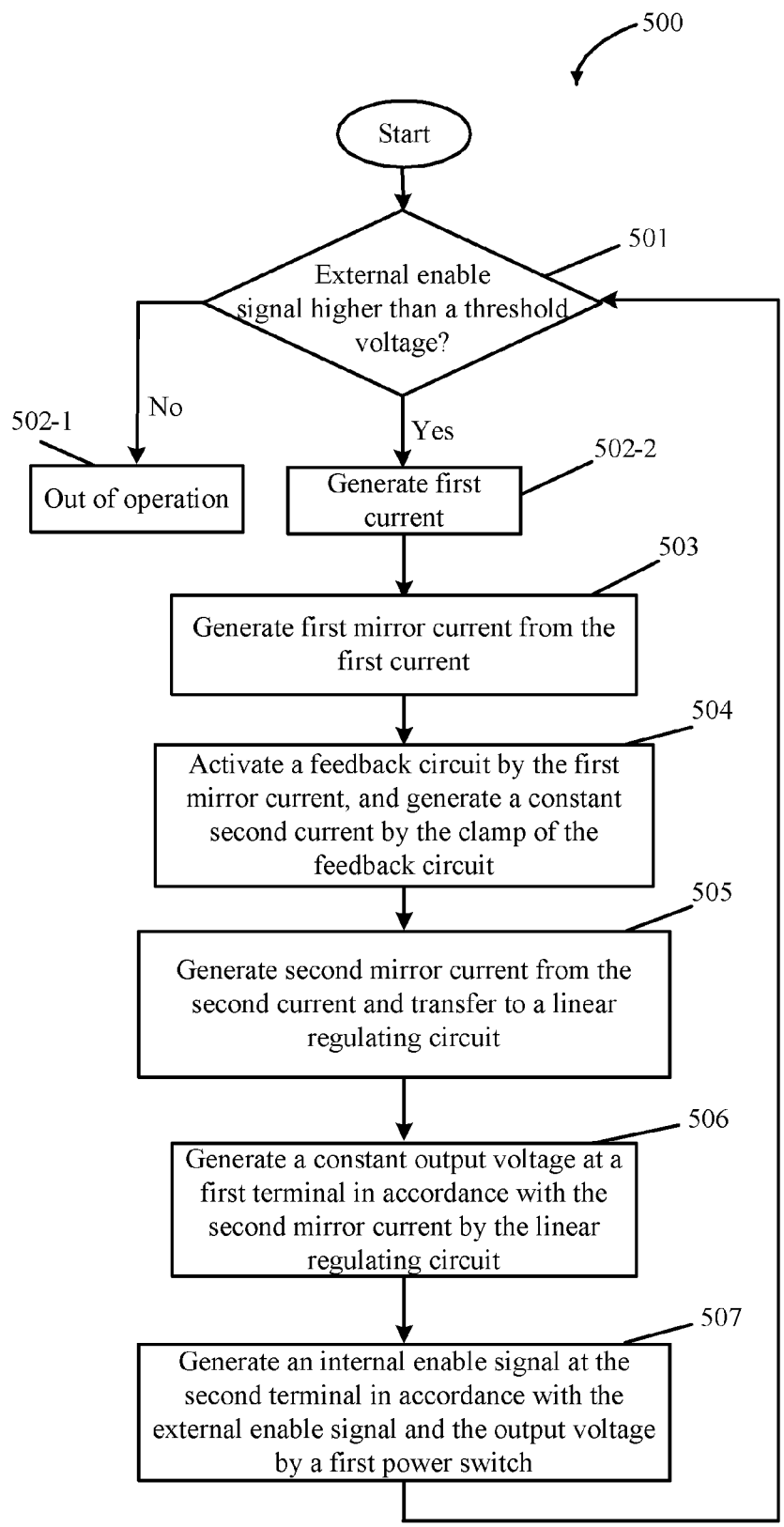
FIG. 5 is a flow diagram of a second example driving method with zero current shutdown in accordance with embodiments of the present invention.

Referring now to FIG. 5, shown is a flow diagram 500 of a second example driving method in accordance with embodiments of the present invention. At 501, an external enable signal can be received and determined to be higher or lower than a threshold voltage. At 502-1, the driving circuit may be out of operation if the external enable signal is lower than the threshold voltage. At 502-2, a first current can be generated if the external enable signal is higher than the threshold voltage.

At 503, the first current can be mirrored in order to generate a first mirror current. At 504, the feedback circuit may be activated by the first mirror current and clamped by the feedback operation to generate a second current. An improved regulation effect of the linear regulation circuit can be achieved by use of the constant second current as the source of bias current.

At 505, the second current can be mirrored to generate a second mirror current that is transferred or otherwise coupled to the linear regulating circuit. At 506, the linear regulating circuit may receive the second mirror current and output a substantially constant output voltage signal at the first output terminal. At 507, the first power switch may generate an enable signal to drive, e.g., one or more chip internal logic circuits according to the external enable signal and the output voltage signal of the linear regulating circuit.

In this fashion, no additional power loss may be generated due to the out of operation of the linear regulation circuit and the lack of bias current when the chip is in an off or shutdown condition. The linear regulating circuit may be in operation only when the external enable signal is higher than a threshold that is related to the threshold voltage of a power switch. Particular embodiments are also suitable to wide application conditions that have different ranges of input voltage sources and external enable signals due to the relatively constant second current.

The foregoing descriptions of specific embodiments of the present invention have been presented through images and text for purpose of illustration and description of the start-up circuit and method. They are not intended to be exhaustive or to limit the invention to the precise forms disclosed, and obviously many modifications and variations are possible in light of the above teaching, such as the variable number of current mirrors and the alternatives of the type of the power switch utilized for different applications.

The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A driving circuit, comprising:
   a) a linear regulating circuit configured to receive an input voltage source, and to provide an output voltage based on a first current;
   b) a first power switch configured to receive said output voltage of said linear regulating circuit and an external enable signal, and to generate an internal enable signal configured to drive a logic circuit; and
   c) a start-up circuit configured to receive said external enable signal at a gate of a second power switch, wherein when said external enable signal is lower than a threshold voltage that is related to said second power switch, said start-up circuit is configured to disable said first current and said driving circuit, and when said external enable signal is higher than said threshold voltage, said start-up circuit is configured to generate said first current and enable said driving circuit, wherein said start-up circuit comprises a first resistor connected to said second power switch at a node having no other connections thereto.

2. The driving circuit of claim 1, further comprising a first current mirror coupled to said input voltage source, said linear regulating circuit, and said start-up circuit, wherein said first current mirror is configured to mirror said first current to generate a first mirror current when said external enable signal is higher than said threshold voltage, and wherein said first mirror current is configured to be transferred to said linear regulating circuit to be treated as a bias current of said linear regulating circuit.

3. The driving circuit of claim 1, wherein said first power switch comprises a MOS transistor, and wherein a gate of said first power switch is coupled to said output voltage at a first output terminal, a drain of said first power switch is coupled to said external enable signal, and a source of said first power switch is coupled to said internal enable signal at a second output terminal.

4. The driving circuit of claim 3, further comprising:
a) a first inverter coupled to said source of said first power switch; and
b) a second inverter coupled in series with said first inverter, wherein an output of said second inverter is coupled to said second output terminal.

5. The driving circuit of claim 2, wherein said start-up circuit further comprises a first resistor coupled in series with said second power switch, wherein said second power switch is coupled to said first current mirror and a first terminal of said first resistor, wherein a second terminal of said first resistor is coupled to ground.

6. The driving circuit of claim 5, wherein said second power switch comprises a MOS transistor, wherein a source of said second power switch is coupled to said first resistor, and a drain of said second power switch is coupled to said input voltage source, wherein said second power switch is configured to turn on when said external enable signal is higher than said threshold voltage, and a current flowing through said first resistor is configured to be used as said first current and to be coupled to said linear regulating circuit as said bias current.

7. The driving circuit of claim 2, further comprising a feedback circuit coupled to said start-up circuit and said first current mirror, wherein when said external enable signal is higher than said threshold voltage of said start-up circuit, said first mirror current is generated by said first current mirror based on said first current, wherein said first current is configured to be received by said feedback circuit to generate a second current with a substantially constant value.

8. The driving circuit of claim 7, further comprising a second current mirror coupled to said first current mirror, said input voltage source, and said feedback circuit, wherein said second current mirror is configured to mirror said second current generated by said feedback circuit to generate a second mirror current, wherein said second mirror current is configured to be coupled to said linear regulating circuit as said bias current.

9. The driving circuit of claim 7, wherein said feedback circuit comprises:
a) a third power switch having a source that is grounded, and a drain that is coupled to said first current mirror;
b) a fourth power switch having a gate coupled to said first current mirror, and a drain that is coupled to said second current mirror;
c) a second resistor having a first terminal coupled to a common node between said gate of said third power switch and said source of said fourth power switch;
d) a bipolar transistor having a base that is coupled to a first terminal of said first resistor, an emitter that is coupled to ground, and a collector that is coupled to a second terminal of said second resistor; and
e) wherein when said external enable signal is higher than a sum of threshold voltages of both said second power switch and said bipolar transistor, said start-up circuit is configured to generate said first current on a first side of said first current mirror that is transferred to said third power switch and said fourth power switch, wherein a gate voltage of said third power switch is configured to be clamped by negative feedback control to generate said second current on a side of said fourth power switch that is in direct proportion to a threshold voltage of said third power switch and in inverse proportion to a sum of said second resistor and an on-resistance of said bipolar transistor.

10. The driving circuit of claim 9, wherein said bipolar transistor comprises an NPN-type bipolar transistor, and each of said third and fourth power switches comprises a P-type MOS transistor.

11. A driving method with zero current shutdown, the method comprising:
a) receiving an external enable signal at a gate of a start-up transistor, wherein said start-up transistor is connected to a first resistor at a node having no other connections thereto;
b) determining that a chip is in shutdown when said external enable signal is lower than a threshold voltage that is related to said start-up transistor;
c) disabling a first current by said start-up transistor when said chip is in shutdown;
d) determining that said chip is out of shutdown and generating said first current when said external enable signal is higher than said threshold voltage;
e) generating, by a linear regulating circuit, an output voltage at a first output terminal based on said first current; and
f) generating an internal enable signal to drive internal logic at a second output terminal through a first power switch that is driven by said external enable signal and said output voltage.

12. The driving method of claim 11, further comprising mirroring said first current to generate a first mirror current configured as a bias current of said linear regulating circuit.

13. The driving method of claim 11, further comprising:
a) keeping said start-up transistor off when said external enable signal is lower than said threshold voltage, and said first current is zero; and
b) turning on said start-up transistor when said external enable signal is higher than said threshold voltage, and said first current is generated by an input resistor coupled in series with said start-up transistor.

14. The driving method of claim 12, further comprising:
a) activating a feedback circuit by said first mirror current; and
b) clamping said feedback circuit by a feedback control to generate a second current.

15. The driving method of claim 14, further comprising mirroring said second current to generate a second mirror current configured as said bias current of said linear regulating circuit.

16. The driving method of claim 14, wherein said feedback circuit comprises:
a) a third power switch and a fourth power switch that are coupled between said first current mirror and said second current mirror; and
b) wherein said third and fourth power switches are configured to receive said first mirror current, and a gate voltage of said third power switch is clamped by a feedback control to generate a constant bias current at one side of said second current mirror to said linear regulation circuit.

* * * * *